(12) United States Patent
Choi

(10) Patent No.: US 6,740,166 B2
(45) Date of Patent: May 25, 2004

(54) THIN FILM DEPOSITION APPARATUS FOR SEMICONDUCTOR

(75) Inventor: Won-sung Choi, Pyuntaek-si (KR)

(73) Assignee: IPS, Ltd. (KR)

( * ) Notice: Subject to any disclaimer, the term of this patent is extended or adjusted under 35 U.S.C. 154(b) by 39 days.

(21) Appl. No.: 09/726,977

(22) Filed: Nov. 30, 2000

(65) Prior Publication Data

US 2002/0134307 A1 Sep. 26, 2002

(30) Foreign Application Priority Data

Dec. 17, 1999 (KR) ........................ 1999-58541

(51) Int. Cl.[7] ................. H01L 21/00; C23C 16/00
(52) U.S. Cl. ............... 118/715; 712/724; 712/725; 156/345.24; 422/168
(58) Field of Search ................ 118/715, 725, 118/724; 156/345, 345.24; 422/168

(56) References Cited

U.S. PATENT DOCUMENTS

| | | | | |
|---|---|---|---|---|
| 5,091,207 A | * | 2/1992 | Tanaka | 118/50 |
| 5,290,381 A | * | 3/1994 | Nozawa et al. | 118/715 |
| 5,352,615 A | * | 10/1994 | Lim et al. | 148/DIG. 60 |
| 5,470,390 A | * | 11/1995 | Nishikawa et al. | 118/715 |
| 5,928,428 A | * | 7/1999 | Horie | 118/715 |
| 5,976,471 A | * | 11/1999 | Simandl et al. | 422/122 |
| 6,004,397 A | * | 12/1999 | Park et al. | 118/715 |

FOREIGN PATENT DOCUMENTS

| | | |
|---|---|---|
| EP | 0 861 683 | 9/1998 |
| JP | 56 114809 | 9/1981 |
| JP | 05 234882 | 9/1993 |
| JP | 05 247654 | 9/1993 |
| WO | WO 97/22992 | 6/1997 |

OTHER PUBLICATIONS

Abstract for Patent No. 00311218.2.

* cited by examiner

Primary Examiner—Gregory Mills
Assistant Examiner—Ram N Kackar
(74) Attorney, Agent, or Firm—Cantor Colburn LLP

(57) ABSTRACT

A semiconductor thin film deposition apparatus having at least one reactor in which a wafer is received, a gas supply portion for supplying a reaction gas or inert gas to the reactor, and an exhaust pump for exhausting gas from the reactor, characterized in that the improvement comprises an ozone supply portion for generating ozone as a gas that reacts with the reaction gas, and for supplying the ozone to the reactor.

14 Claims, 1 Drawing Sheet

THIN FILM DEPOSITION APPARATUS FOR SEMICONDUCTOR

BACKGROUND OF THE INVENTION

1. Field of the Invention

The present invention relates to a thin film deposition apparatus for a semiconductor, and more particularly, to a semiconductor thin film deposition apparatus which can deposit a thin film, for example, an aluminum oxide film, on a wafer using ozone and also perform thermal treatment using ozone.

2. Description of the Related Art

General thin film deposition apparatuses for depositing a thin film on a wafer use deionized (DI) water vapor as a reaction gas for oxidation. For example, an aluminum oxide film can be formed at a thickness of an atomic layer by continuously introducing DI water vapor and TriMethylAluminum (TMA) gas into a reactor on which a wafer is loaded, and subsequently purging the introduced DI water vapor and TMA reaction gas.

However, when DI water vapor is used, an O—H group exists within a thin film, for example, an aluminum oxide film, formed by a thin film deposition process or by thermal treatment, thus degrading the characteristics of the thin film. That is, H existing in the thin film causes damage to the thin film, thereby degrading the characteristics of the thin film.

SUMMARY OF THE INVENTION

To solve the above problem, an objective of the present invention is to provide a semiconductor thin film deposition apparatus in which the use of ozone as a reaction gas for oxidation prevents defects from being generated within a thin film deposited on a wafer.

To achieve the above objective, the present invention provides a semiconductor thin film deposition apparatus having at least one reactor in which a wafer is received, a gas supply portion for supplying a reaction gas or inert gas to the reactor, and an exhaust pump for exhausting gas from the reactor, characterized in that the improvement comprises an ozone supply portion for generating ozone as a gas that reacts with the reaction gas, and for supplying the ozone to the reactor.

BRIEF DESCRIPTION OF THE DRAWINGS

The above objective and advantages of the present invention will become more apparent by describing in detail a preferred embodiment thereof with reference to the attached drawings in which.

DESCRIPTION OF THE PREFERRED EMBODIMENT

Figure 1:
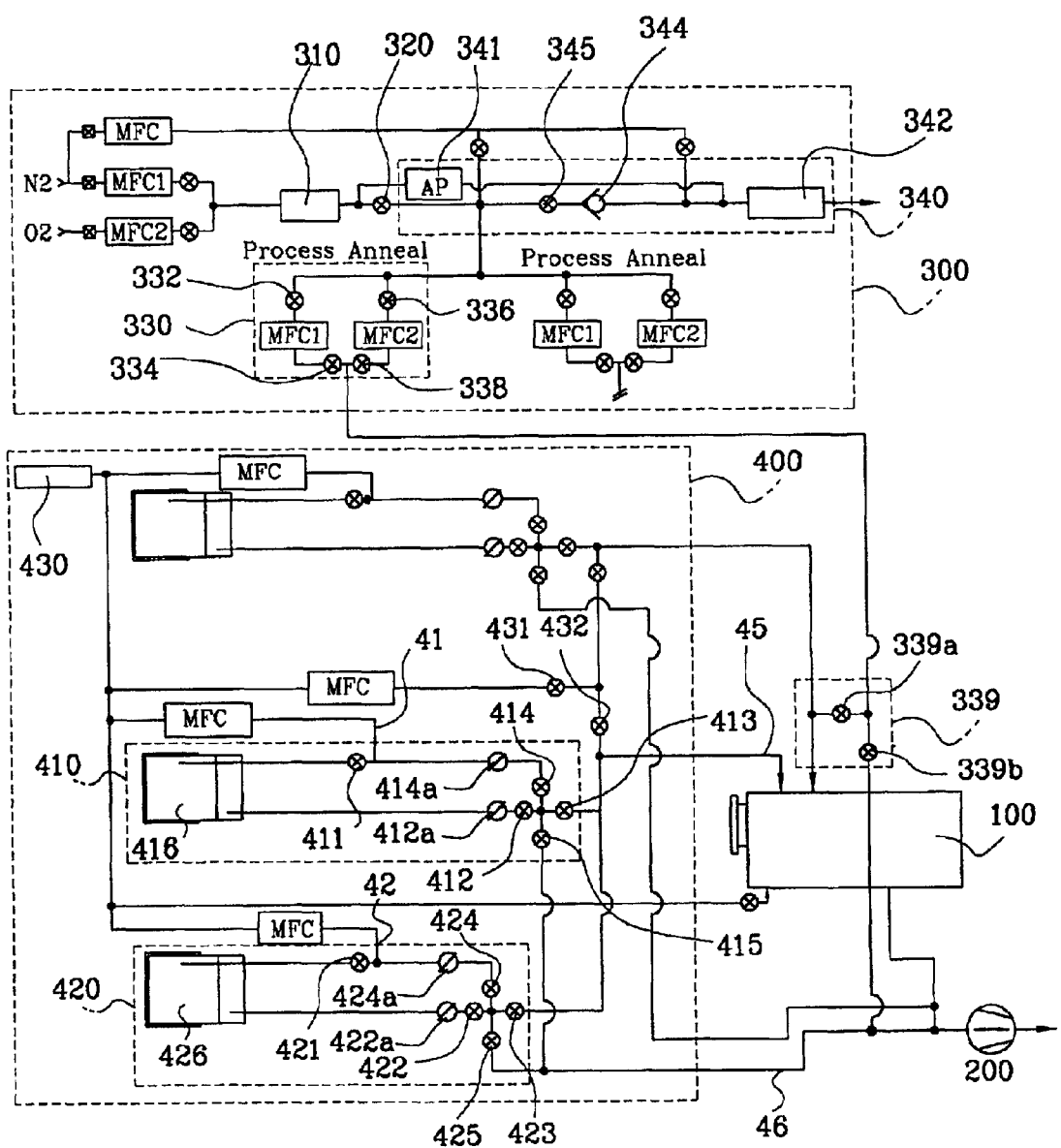
FIG. 1 is a schematic diagram of one embodiment of the semiconductor thin film deposition apparatus according to the present invention.

Referring to FIG. 1, a semiconductor thin film deposition apparatus according to the present invention includes at least one reactor 100 in which a wafer (not shown) is received, an exhaust pump 200 for exhausting gas from the reactor 100, an ozone supply portion 300 for generating ozone that is supplied to the reactor 100, and a gas supply portion 400 for generating a reaction gas or inert gas that is supplied to the reactor 100. This thin film deposition apparatus uses ozone for being reacted with the reaction gas to deposit a thin film on a wafer.

The semiconductor thin film deposition apparatus may further include a heater (not shown) as a thermal treatment means for performing thermal treatment on a wafer received in the reactor 100. The heater can control the temperature of the reactor in a range of 300 to 700° C.

The ozone supply portion 300 includes an ozone generator 310, a main valve 320 connected to the ozone generator 310 for allowing ozone to flow or for blocking the flow of ozone, an ozone transfer unit 330 for transferring ozone, which has passed through the main valve 320, to the reactor 100, and an ozone control unit 340 for allowing a certain amount of ozone to flow to the ozone transfer unit 330 when an excessive amount of ozone is generated by the ozone generator 310.

The ozone transfer unit 330, for guiding ozone generated by the ozone generator 310 to the reactor 100, is designed so that ozone used in a thin film deposition process for a wafer received within the reactor 100 is transferred separately from ozone used in thermal treatment on the wafer. That is, the ozone transfer unit 330 is connected to the main valve 320 in parallel, and includes a process ozone transfer member for transferring ozone used for a thin film deposition process, a thermal treatment ozone transfer member for transferring ozone used for thermal treatment. A selection transfer member 339 selectively transfers ozone which has passed through the process ozone transfer member or thermal treatment ozone transfer member, to the reactor 100 or exhaust pump 200. In FIG. 1, two ozone transfer units are shown. However, the other transfer unit will not be described because it has the same structure as the above-described ozone transfer unit 330. If several ozone transfer units described above are used, an equal number of reactors can be operated.

The process ozone transfer member is made up of a first process valve 332, a process mass flow controller (MFC1), and a second process valve 334, which are sequentially connected.

The thermal treatment ozone transfer member is made up of a first thermal treatment valve 336, a thermal treatment mass flow controller (MFC2), and a second thermal treatment valve 338, which are sequentially connected.

The selection transfer member 339 is made up of a first selection valve 339a and a second selection valve 339b. The first selection valve 339a is connected to a line between the second process valve 334 and the second thermal treatment valve 338, and the reactor 100, and allows or blocks the flow of ozone to the reactor 100. The second selection valve 339b is connected to a line between the second process valve 334 and the second thermal treatment valve 338, and the exhaust pump 200, and allows or blocks the flow of ozone to the exhaust pump 200. If the second selection valve 339b is opened, ozone which has passed through the second process valve 334 and the second thermal treatment valve 338 is applied to the exhaust pump 200. The first and second selection valves 339a and 339b perform opposite operations at the same time. That is, when the first selection valve 339a is turned off, the second selection valve 339b is turned on, and vice versa.

The process MFC1 and the thermal treatment MFC2 control the flow of ozone. The process MFC1 controls the flow of ozone used in a thin film deposition process in a range of 100 to 500 sccm (standard cc/min). The thermal treatment MFC2 controls the flow of ozone used for thermal treatment up to 20000 sccm.

It is not easy to control the amount of ozone generated by the ozone generator 310 in an the exact amount actually used in a thin film deposition process or thermal treatment. In practice, a small amount of ozone is used in a deposition process or thermal treatment process. However, the ozone generator 310 generally generates an excessive amount. Thus, a high ozone pressure is applied to a line connected between the ozone generator 310 and the main valve 320. When an excessive ozone pressure is applied to the line, even the MFC1 and MFC2 cannot properly control the flow of ozone. In this case, the ozone control unit 340 is operated.

The ozone control unit 340 includes an automatic pressure valve 341 and an ozone remover 342 which are installed on the line between the main valve 320 and the ozone generator 310. The automatic pressure valve 341 is automatically opened when the ozone pressure is equal to or greater than a predetermined value, and the ozone remover 342 removes ozone which has passed through the automatic pressure valve 341. For example, the ozone remover 342 can be a catalyzer that converts harmful ozone to harmless oxygen or another gas through a catalyzed chemical reaction and then exhausts the resultant gas. The ozone control unit 340 further includes a valve 345 and a check valve 344 which are installed on the line between the main valve 320 and the ozone remover 342. The valve 345 allows/blocks the flow of ozone, and the check valve 344 allows ozone having a predetermined pressure or greater to flow only toward the ozone remover 342.

When an excessive ozone pressure is applied to the line due to an increase in the amount of ozone generated by the ozone generator 310, the pressure is fed back to operate the ozone control unit 340. That is, when the ozone pressure is equal to or greater than a predetermined value, the pressure valve 341 is opened, so that a superfluous amount of ozone flows toward the ozone remover 342. Also, in the ozone remover 342, the introduced ozone is converted into harmless gas by a catalyst, and then the harmless gas is exhausted.

The ozone control unit 340 can maintain the pressure of ozone flowing into the ozone transfer unit 330 to be uniform, and thus can guide ozone at a stable state.

In the ozone supply portion, ozone generated by the ozone generator 310 flows into the reactor 100 along a route starting from the main valve 320 to the first process valve 332, to the process MFC1, to the second process valve 334, to the first selection valve 339a, or along a route starting from the main valve 320 to the first thermal treatment valve 336, to the thermal treatment MFC2, to the second thermal treatment valve 338, to the first selection valve 339a. That is, ozone can be selectively allowed to flow into the reactor 100 by selectively turning on or off the first process valve 332 or the first thermal treatment valve 336. The first and second selection valves 339a and 339b perform opposite operations at the same time, so that when the first selection valve 339a is turned off, the second selection valve 339b is turned on. Hence, ozone is exhausted directly to the outside by the exhaust pump 200.

The gas supply portion 400 includes a first reaction gas supply unit 410 for supplying a first reaction gas to the reactor 100, a second reaction gas supply unit 420 for supplying a second reaction gas, and an inert gas supply unit 430 for supplying an inert gas used as a carrier gas or a purging gas.

The first and second reaction gas supply units 410 and 420, and the inert gas supply unit 430 are connected to each other by a pipe line, and several valves 411, 412, 413, 414, 415, 421, 422, 423, 424 and 425 are installed on the line. These valves are connected to a controller (not shown) to allow/block the flow of gas.

The first reaction gas supply unit 410 includes a first reaction material container 416 filled with a first liquid reaction material to be vaporized and used as a first reaction gas, a mass flow controller (MFC) for controlling the flow of a carrier gas for transferring the first reaction gas to the reactor 100, a first flow control valve 412a installed between the first reaction material container 416 and a valve 412, and a second flow control valve 414a installed between the MFC and the valve 414. The first and second flow control valves 412a and 414a consecutively control the flow of gas, and uniformly raise/maintain the vapor pressure of a gas introduced into the reactor 100. In this embodiment, argon is used as the inert carrier gas. However, various inert gases such as neon can be used instead of argon.

The second reaction gas supply unit 420 includes a second reaction material container 426 filled with a second liquid reaction material to be vaporized and used as a second reaction gas, an MFC for controlling the flow of a carrier gas for transferring the second reaction gas to the reactor 100, a first flow control valve 422a installed between the second reaction material container 426 and the valve 422, and a second flow control valve 424a installed between the MFC and the valve 424. The first and second flow control valves 422a and 424a consecutively control the flow of gas, and uniformly raise/maintain the vapor pressure of a gas introduced into the reactor 100.

It is preferable that the first and second flow control valves 412a, 414a, 422a and 424a adopted in the first and second gas supply units 410 and 420 are meter valves or control valves. It is also preferable that the first and second flow control valves 412a, 414a, 422a and 424a are installed in front of the valves 412, 414, 422 and 424, and that the distance between a flow control valve and an adjacent valve is minimized in order to control the flow of gas at a stable constant pressure. The flow control valves 412a, 414a, 422a and 424a control the flow of gas by adjusting the cross-sectional area through which gas passes.

In the gas supply portion 400, if the valves 411, 412 and 413 are opened, a transfer gas introduced via a first supply line 41 and the valve 411 flows into the reactor 100 via a route from the flow control valve 412a, to the valves 412 and 413, to a reactor line 45, together with the first reaction gas of the first reaction material container 416.

Then, if the valves 414 and 415 are opened, a carrier gas introduced via the first supply line 41 is exhausted to the outside through a route from the second flow control valve 414a, to the valves 414 and 415, to an exhaust line 46, to the exhaust pump 200. The first and second flow control valves 412a and 414a consecutively control the flow of gas, uniformly raise/maintain the vapor pressure of a gas flowing into the reactor 100, and equalize the pressure of a gas applied to the reactor 100 with the pressure of a gas applied to the exhaust pump 200.

Next, an inert gas flows into the reactor 100 along a route from the valve 431 to the valve 432 to the reactor line 45, and exhausts a reaction gas that remains within the reactor 100.

Thereafter, the second reaction gas of the second reaction material container 426 is allowed to flow into the reactor 100 via a route from the first flow amount control valve 422a, to the valves 422 and 423, to the reactor line 45, along with the carrier gas introduced via a second supply line 42 and the valve 421. Then, if the valves 424 and 425 are opened, the carrier gas is exhausted to the outside via the route from the second flow amount control valve 424a, to the valves 424 and 425, to the exhaust line 46, to the exhaust pump 200.

The first and second flow control valves 422a and 424a consecutively control the flow of gas, uniformly raise/maintain the vapor pressure of a gas flowing into the reactor 100, and equalize the pressure of a gas applied to the reactor 100 with the pressure of a gas applied to the exhaust pump 200.

An inert gas flows into the reactor 100 along a route from the valve 431 to the valve 432 to the reactor line 45, and exhausts a reaction gas that remains within the reactor 100.

In this embodiment as shown in FIG. 1, two ozone transfer units are shown, and three reaction gas supply units are shown. However, only the ozone transfer unit 330 and two reaction gas supply units 410 and 420 have been described to simplify explanation.

Referring to FIG. 1, the operation of the semiconductor thin film deposition apparatus is described for forming an aluminum oxide layer as an example of a thin film. Thermal treatment using ozone is performed as a pre-process for easily depositing a thin film on a wafer. In the thermal treatment, the internal temperature of the reactor 100 is increased to a range of 300 to 700° C., and ozone is supplied into the reactor 100. According to this thermal treatment, ozone generated by the ozone generator 310 is introduced into the reactor 100 via a route from the main valve 320, to the first thermal treatment valve 336, to the thermal treatment MFC2, to the second thermal treatment valve 338, and to the first selection valve 339a. It is preferable that the thermal treatment is performed at a temperature as high as possible to accelerate decomposition of ozone.

After the thermal treatment is performed, ozone and a reaction gas flow into a reactor at the same time or a time interval apart, in order to deposit an aluminum oxide film on a wafer. That is, ozone generated by the ozone generator 310 flows into the reactor 100 via a route from the main valve 320, to the first process valve 332, to the process MFC1, to the second process valve 334, and to the selection valve 339a. Meanwhile, the first reaction gas of the first reaction material container 416 flows into the reactor 100 via a route from the flow control valve 412a, to the valves 412 and 413, and to the reactor line 45 along with a carrier gas introduced via the first supply line 41 and the valve 411, as the valves 411, 412 and 413 are opened. The ozone and the first reaction gas flowing into the reactor 100 react with each other, so that an aluminum oxide film is deposited on the wafer.

Next, in order to purge the reactor 100, an inert gas flows into the reactor 100 via a route from the valve 431, to the valve 432 and to the reactor line 45 to exhaust the ozone and first reaction gas within the reactor 100.

Following this, a thin film deposition process is continuously performed by supplying the second reaction gas of the second reaction material container 426, together with ozone, into the reactor 100 through a similar operation to that described above. A thin film can be deposited at a thickness of an atomic layer by varying the inflow duration of a reaction gas or ozone. Also, an inert gas for purging is allowed to flow into the reactor between the times for introducing ozone and a reaction gas.

When a predetermined thin film is deposited on a wafer, the internal temperature of the reactor is increased to a range of 300 to 700° C., and ozone is supplied into the reactor. In this way, thermal treatment is performed.

It is preferable that the flow of ozone is made equal to those of the first and second reaction gases, in order to suppress a change in the pressure of a reactor due to the sequential inflow of ozone and first and second reaction gases.

As described above, in the semiconductor thin film deposition apparatus according to the present invention, a defectless thin film can be formed on a wafer using ozone instead of deionized (DI) water vapor for oxidation as in the prior art. That is, in contrast to the prior art, generation of an H group that can permeate into a thin film is prevented, so that defects in a thin film caused by H can be prevented.

Also, thermal treatment can be performed together with a thin film deposition process, leading to deposition of a high-quality thin film and a simple process.

What is claimed is:

1. A semiconductor thin film deposition apparatus comprising:

a reactor in which a wafer is received;

a reaction gas supply unit for providing reaction gas to the reactor;

an inert gas supply unit for providing inert gas to the reactor;

an exhaust pump for exhausting gas from the reactor;

an ozone generator for generating ozone to react with the reaction gas;

a first ozone transfer unit having a first mass flow controller connected to the ozone generator, for receiving the ozone from the ozone generator to provide the reactor with a first ozone flow at a first flow rate for a thin film deposition on the wafer, wherein the first ozone flow and the reaction gas are configured to flow into the reactor at respective times different from each other;

a second ozone transfer unit having a second mass flow controller connected to the ozone generator, for receiving the ozone from the ozone generator to provide the reactor with a second ozone flow at a second flow rate for a thermal treatment on the wafer, the first and second mass flow controllers being connected parallel to each other between the ozone generator and the reactor, wherein one of the first and second mass flow controllers provides corresponding one of the first and second ozone flows to the reactor at a time;

an ozone control unit connected to the ozone generator in parallel with the first and second ozone transfer units, for receiving the ozone from the ozone generator to allow a certain amount of ozone to flow to the first and second ozone transfer units by removing an excessive amount of ozone generated by the ozone generator;

a first selection valve connected between the first and second ozone transfer units and the reactor, for controlling the first or second ozone flow from the first or second ozone transfer unit to the reactor; and a second selection valve connected between the first and second ozone transfer units and the exhaust pump, for controlling the first or second ozone flow from the first or second ozone transfer unit to the exhaust pump, wherein the first and second selection valves are configured to preform opposite operations at a same time.

2. The semiconductor thin film deposition apparatus of claim 1, further comprising a main valve disposed between the ozone generator and the first and second ozone transfer units, for controlling a flow of the ozone from the ozone generator to the first and second ozone transfer units.

3. The semiconductor thin film deposition apparatus of claim 2, wherein the first ozone transfer will further comprises:

a first ozone transfer valve having an inlet connected to an outlet of the main valve of which inlet is connected to an outlet of the ozone generator, and an outlet connected to an inlet of the first mass flow controller; and a second ozone transfer valve having an inlet connected to an outlet of the first mass flow controller and an outlet generating the first ozone flow to the first and second selection valves.

4. The semiconductor thin film deposition apparatus of claim 3, wherein the second ozone transfer unit further comprises:

a third ozone transfer valve having an inlet connected to the outlet of the main valve to which the inlet of the first ozone transfer valve is connected, and an outlet connected to an inlet of the second mass flow controller; and a fourth ozone transfer valve having an inlet connected to an outlet of the second mass flow controller and an outlet generating the first ozone flow to the first and second selection valves.

5. The semiconductor thin film deposition apparatus of claim 4, wherein the ozone control unit comprises;

an automatic pressure valve connected to the ozone generator in parallel with the main valve, for being automatically opened to receive the ozone from the ozone generator when pressure of the ozone generated from the ozone generator is equal to or greater than a predetermined value; and an ozone remover for receiving and removing ozone which has passed through the automatic pressure valve.

6. The semiconductor thin film deposition apparatus of claim 5, wherein the ozone control unit further comprises a check valve connected between the main valve and the ozone remover, for allowing the ozone passing through the automatic pressure valve to flow only toward the ozone remover when pressure of the ozone generated from the ozone generator is equal to or greater than the predetermined value.

7. The semiconductor thin film deposition apparatus of claim 6, wherein the automatic pressure valve has an inlet connected to the outlet of the ozone generator and an inlet of the main valve, the ozone remover has an inlet connected to an outlet of the automatic pressure valve, and the check valve is connected between the outlet of the main valve and the inlet of the ozone remover.

8. The semiconductor thin film deposition apparatus of claim 1, wherein the first flow rate of the first ozone flow is in a range from about 100 sccm to about 500 sccm.

9. The semiconductor thin film deposition apparatus of claim 8, wherein the second flow rate of the second ozone flow is in a range from about 100 sccm to about 20000 sccm.

10. The semiconductor thin film deposition apparatus of claim 4, further comprising a heater for providing heat to perform the thermal treatment on the wafer in the reactor.

11. The semiconductor thin film deposition apparatus of claim 10, wherein the heat has a temperature in a range from about 300° C. to about 700° C.

12. The semiconductor thin film deposition apparatus of claim 1, wherein the inert gas is argon.

13. The semiconductor thin film deposition apparatus of claim 4, wherein the first selection valve has an inlet connected to both the outlets of the second and fourth ozone transfer valves and an outlet connected to an inlet of the reactor, and the second selection valve has an inlet connected to both the outlets of the second and fourth ozone transfer valves and an outlet connected to the exhaust pump.

14. The semiconductor thin film deposition apparatus of claim 4, wherein the first ozone transfer valve and the third ozone transfer valve are controlled to be selectively opened so that the ozone from the main valve is provided to the reactor through one of the first and second ozone transfer units.

* * * * *